(12) United States Patent
Bakker et al.

(10) Patent No.: US 8,753,915 B2
(45) Date of Patent: Jun. 17, 2014

(54) METHOD AND DEVICE FOR PRODUCING A SOLAR PANEL USING A CARRIER

(75) Inventors: Jan Bakker, Bleskensgraaf (NL); Abraham Jan Verschoor, Wijngaarden (NL); Simon Den Hartigh, Oud Alblas (NL)

(73) Assignee: Eurotron B.V., Bleskensgraaf (NL)

( * ) Notice: Subject to any disclaimer, the term of this patent is extended or adjusted under 35 U.S.C. 154(b) by 0 days.

(21) Appl. No.: 13/515,121

(22) PCT Filed: Dec. 3, 2010

(86) PCT No.: PCT/NL2010/050814
§ 371 (c)(1),
(2), (4) Date: Sep. 6, 2012

(87) PCT Pub. No.: WO2011/071373
PCT Pub. Date: Jun. 16, 2011

(65) Prior Publication Data
US 2012/0329202 A1 Dec. 27, 2012

(30) Foreign Application Priority Data
Dec. 10, 2009 (NL) .................................. 2003936

(51) Int. Cl.
*H01L 21/00* (2006.01)
*H01L 31/00* (2006.01)
*H01L 25/04* (2014.01)
*H01L 27/142* (2014.01)

(52) U.S. Cl.
USPC .............. 438/73; 257/E27.125; 257/E25.007; 257/E31.001

(58) Field of Classification Search
USPC ................... 438/57, 64–66, 73; 257/E27.124, 257/E27.125, E27.126, E25.007, E31.001, 257/E25.004–E25.018
See application file for complete search history.

(56) References Cited

U.S. PATENT DOCUMENTS

| 4,154,998 A | 5/1979 | Luft et al. |
| 4,836,861 A | 6/1989 | Peltzer et al. |
| 4,919,951 A | 4/1990 | Jensen et al. |
| 5,630,360 A | 5/1997 | Polny, Jr. |

(Continued)

FOREIGN PATENT DOCUMENTS

| EP | 0497099 A1 | 8/1992 |
| JP | 2008136486 A | 6/2008 |

(Continued)

OTHER PUBLICATIONS

International Search Report and Written Opinion dated Jan. 27, 2011, issued for corresponding PCT/NL2010/050814.
International Preliminary Report on Patentability dated Jun. 12, 2012, issued for corresponding PCT/NL2010/050814.
International Search Report and Written Opinion dated Feb. 2, 2011, issued for corresponding PCT/NL2010/050782.

*Primary Examiner* — Calvin Choi
(74) *Attorney, Agent, or Firm* — Banner & Witcoff, Ltd

(57) ABSTRACT

The invention relates to the production of solar panels which comprise solar cells connected to one another. In this case, various layers are stacked onto one another, such as a film layer, bonding agent, insulating film, solar cells and a support layer. Combining all these layers to form the final panel is carried out on a carrier which stabilizes and supports the stack while it is conveyed past the various treatment stations. The turning over of the stack can also be carried out in a reliable manner by means of such a carrier without shifts between the various components with respect to one another occurring.

5 Claims, 5 Drawing Sheets

(56) References Cited

U.S. PATENT DOCUMENTS

| | | |
|---|---|---|
| 5,972,732 A | 10/1999 | Gee et al. |
| 6,355,976 B1* | 3/2002 | Faris .............................. 257/686 |
| 6,913,985 B2* | 7/2005 | Ogihara et al. ............... 438/462 |
| 2007/0193618 A1 | 8/2007 | Bressler et al. |
| 2008/0142073 A1* | 6/2008 | Sheats et al. .................. 136/252 |
| 2009/0211071 A1* | 8/2009 | Lu et al. ....................... 29/25.01 |

FOREIGN PATENT DOCUMENTS

| | | |
|---|---|---|
| WO | 94/22172 A1 | 6/1994 |
| WO | 2007/108674 A1 | 9/2007 |
| WO | 2007/108680 A1 | 9/2007 |

* cited by examiner

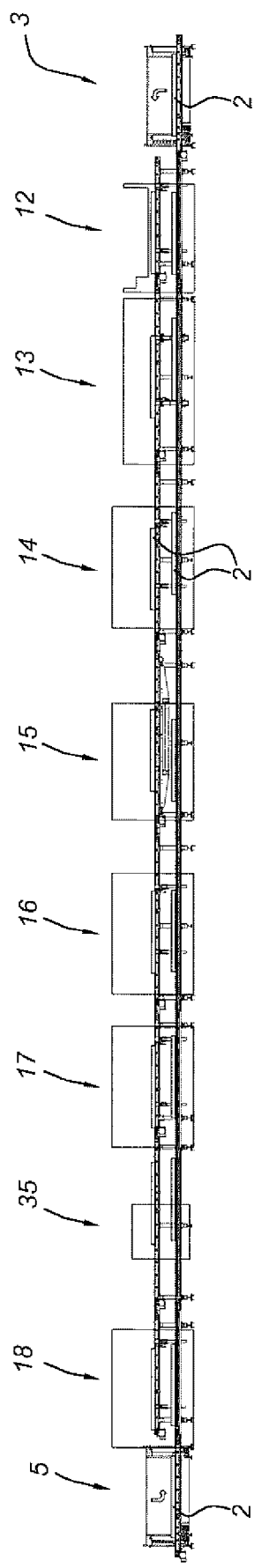

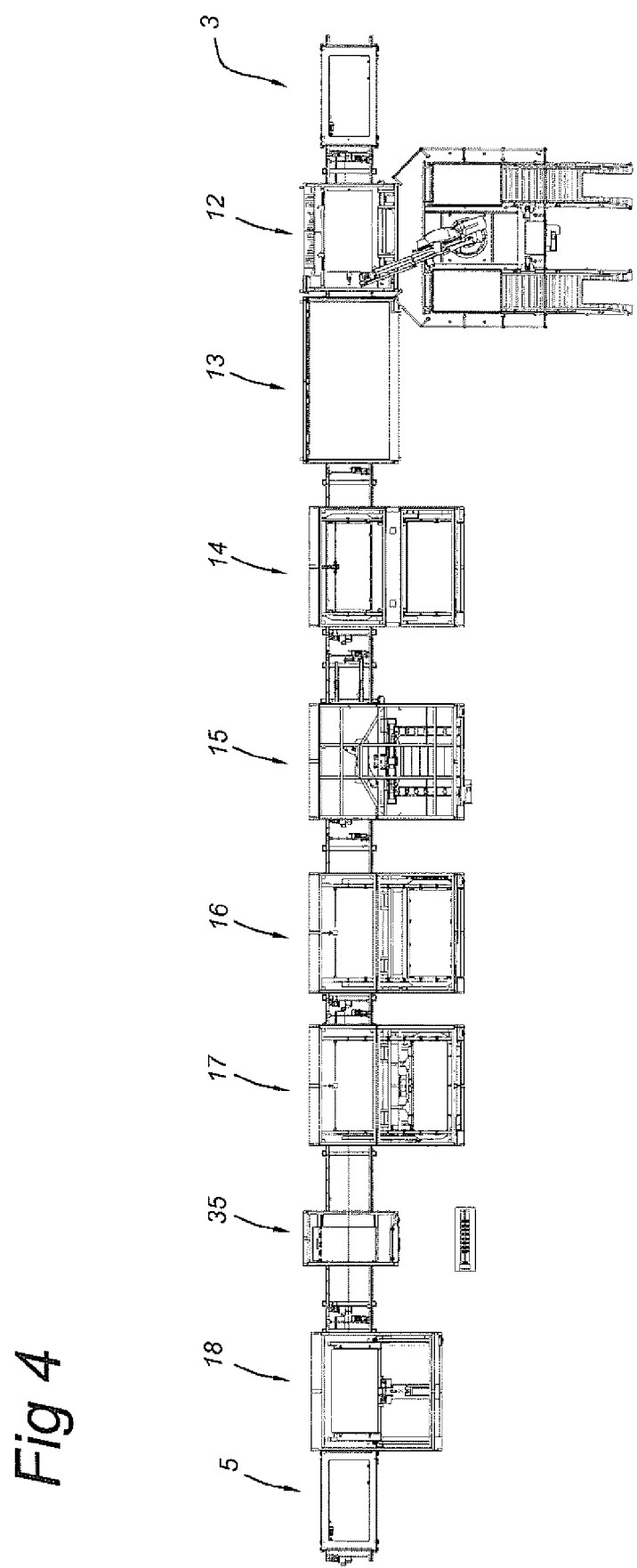

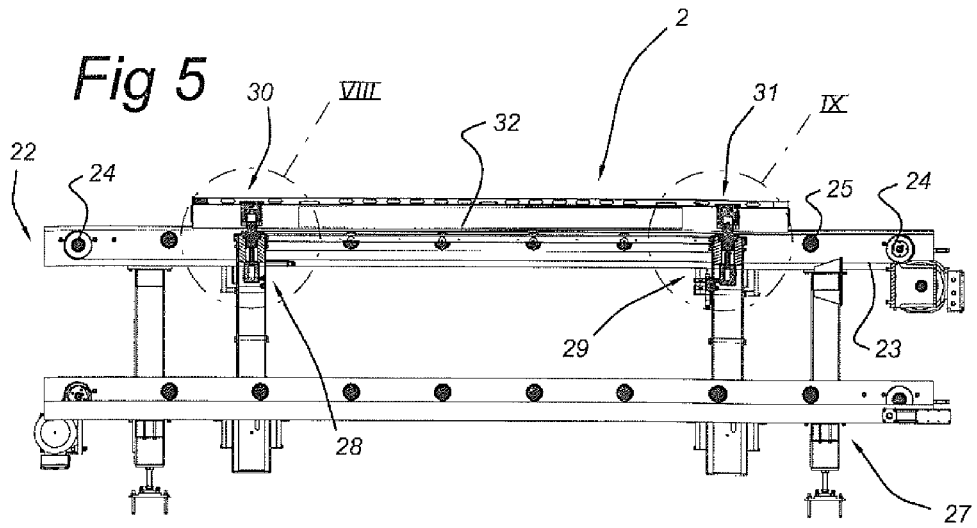
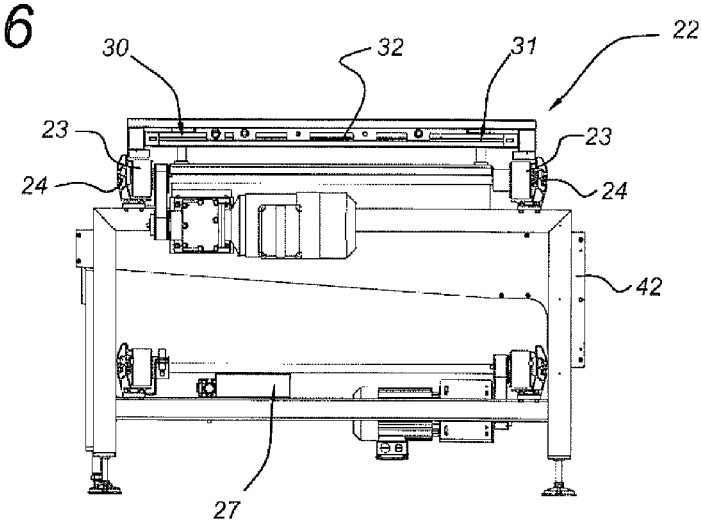

METHOD AND DEVICE FOR PRODUCING A SOLAR PANEL USING A CARRIER

RELATED APPLICATION DATA

This application is a National Stage Application under 35 U.S.C. 371 of PCT application PCT/NL2010/050814, designating the United States and filed Dec. 3, 2010, titled "Method and Device for Producing a Solar Panel Using a Carrier", which claims the priority benefit of NL Patent Application No. 2003936, filed Dec. 10, 2009, titled "Method and Device for Producing a Solar Panel Using a Carrier", the entire disclosure of each of which is hereby incorporated by reference for all purposes.

The invention relates to the production of solar panels which comprise solar cells connected to one another. By means of such solar cells or photovoltaic cells, solar radiation can be transformed into electric power. Usually, the cells consist of crystalline silicon and are connected to one another by an electric circuit. This electric circuit is connected to the contacts of each solar cell.

Solar panels of this type can be produced in various ways. It is known from U.S. Pat. No. 5,972,732 to construct a solar panel from, successively, a film layer, an electrically conductive layer, a series of solar cells, another film layer and, finally, a strong, light-transmitting panel, such as a glass panel. Such a stack is heated in an oven, in which case the film layer, which usually consists of ethylene vinyl acetate, is cured.

However, before the solar panel is prepared by heating and curing of the film layers, the various components thereof are arranged in a stack in a relatively loosely stacked position with respect to one another. In this state, the stack has to be treated carefully, since otherwise the various components may shift with respect to one another. However, as soon as the various components shift, the end product will be faulty, in which case, for example, the electric contacts do not function properly. It is nevertheless inevitable that the stack is subjected to certain conveying movements between the various stations. At each of these stations, a certain operation is performed which is related to the assembly of the stack of layers which eventually are to form the solar panel. In addition, this stack has to be taken from the construction phase to an oven in which the stack is heated and subjected to excess pressure.

It is therefore an object of the invention to provide a method which ensures that the correct construction of the stack is maintained, even when these are still stacked loosely onto one another. This object is achieved by means of a method for producing a solar panel containing a plurality of solar cells, comprising the following steps:

providing a flat carrier,
providing a rear layer with electric conducting means on the carrier,
providing electric conducting means on the rear layer,
providing an electrically conductive bonding agent on the electric conducting means,
providing an electrically insulating thermoplastic insulation layer on the rear layer, which insulation layer is provided with passages to the electric conducting means,
providing solar cells on the insulation layer in such a manner that the electric terminals thereof come into contact electrically with the electrically conductive bonding agent on the electric conducting means via the passages,
providing a light-transmitting thermoplastic layer on the solar cells,
providing a light-transmitting, rigid support layer on the light-transmitting thermoplastic layer,
turning over the carrier with the stack comprising a rear layer, electrically insulating thermoplastic layer, solar cells, light-transmitting thermoplastic layer and support layer,
supporting the stack on the support layer thereof,
removing the carrier.

The stack which consists of the various components for the final solar panel is securely supported by the carrier. When constructing the stack during the various production steps, this ensures that the correct orientation of the components with respect to one another is always maintained. This is particularly important in order to ensure the correct electrical connections between the various solar cells and the electric conducting means, such as an electric circuit, on the rear layer. After the rigid, light-transmitting layer, such as a glass plate, has been placed, the construction of the stack is finished, although the components have not yet been connected to one another.

However, the glass plate also supports the stack in such a manner that the carrier can now be removed.

In this connection, the complete stack with the carrier is turned over, so that the glass plate is now on the bottom side of the stack and the carrier on the top side.

Thereafter, the carrier can be removed and used again to form the next stack. The stack with the glass plate can then be conveyed further to undergo further treatments, in particular heating of the stack in order to bond the various constituent layers thereof.

When turning the stack over, it is important to ensure that the stack remains stable, so that the various layers cannot shift with respect to one another. Therefore, the method preferably also comprises the following steps:

at most partially melting the thermoplastic layers under the effect of heat before turning over the carrier,
at most partially bonding or fixing the stack by cooling down the thermoplastic layers.

The amount of heat supplied and the length of the heating time are chosen such that a secure bond is achieved between the various layers which is, however, less strong than the bond which is eventually to be achieved with the finished product. This means that the associated heating station can be of a relatively simple configuration, and can be incorporated in the treatment path between the various other stations.

Furthermore, a film, such as ethylene vinyl acetate (EVA), is preferably used for the electric insulating layer and for the light-transmitting layer. Likewise preferably, a heat-activatable adhesive is used between the electric connections of the solar cells and the electric conducting means on the rear layer. When the stack is then heated, this not only produces the desired coherence, but also brings about the electric connections.

In particular, heating of the stack can take place in various phases. As has already been mentioned above, the stack in the treatment path is already heated to such an extent that a first, preliminary bond is produced. However, after the stack has been removed from the treatment path, the ultimate bond between the various layers in the stack has to be effected. Therefore, preference is given to a method comprising the following steps:

placing the carrier with the stack in an auxiliary heating station in order to fix the parts of the stack with respect to one another,
transferring the fixed stack to a main heating station,
heating the stack in the main heating station and subjecting it to excess pressure,
cooling down the stack and releasing the excess pressure in order to form a solar panel, removing the carrier with the finished solar panel from the main heating station.

After the various components of the stack have already been partially fixed to one another in the auxiliary heating station, the stack can be conveyed in an even more reliable way between the various treatment stations. Eventually, the ultimate rigidity of the stack is then achieved in the main heating station, resulting in a finished solar panel. The invention furthermore relates to an installation for carrying out the method as described above, comprising at least one carrier, a series comprising several treatment stations between which the carrier can be displaced successively from the first to the last treatment station, return means for returning the carrier from the last to the first treatment station, first transfer means for transferring the carrier from the return means to the first treatment station and second transfer means for transferring the carrier from the last treatment station to the return means.

The various treatment stations placed one behind the other arrange the components on the carrier; therefore, the carrier always has to be positioned correctly in the relevant treatment station. In this connection, the treatment stations and the carrier may have positioning means for positioning the carrier in a predetermined position with respect to this treatment station.

It is advantageous if the carrier can in each case be used again for producing a stack. In order to also achieve this with regard to the installation, the transfer means may each comprise a lift for transferring the carrier between a level at which the positioning means of the treatment stations are situated and a level at which the return means are situated. Furthermore, the last treatment station may comprise turning means for turning over the carrier.

The invention will now be explained in more detail with reference to an illustrative embodiment of the installation according to the invention illustrated in the in the figures, in which:

FIG. 3 shows a side view of the installation according to the invention for producing solar panels;

FIG. 4 shows a top view of the installation;

FIG. 5 shows a side view of a station with a carrier;

FIG. 6 shows a front view of the station with a carrier;

Figure 1:
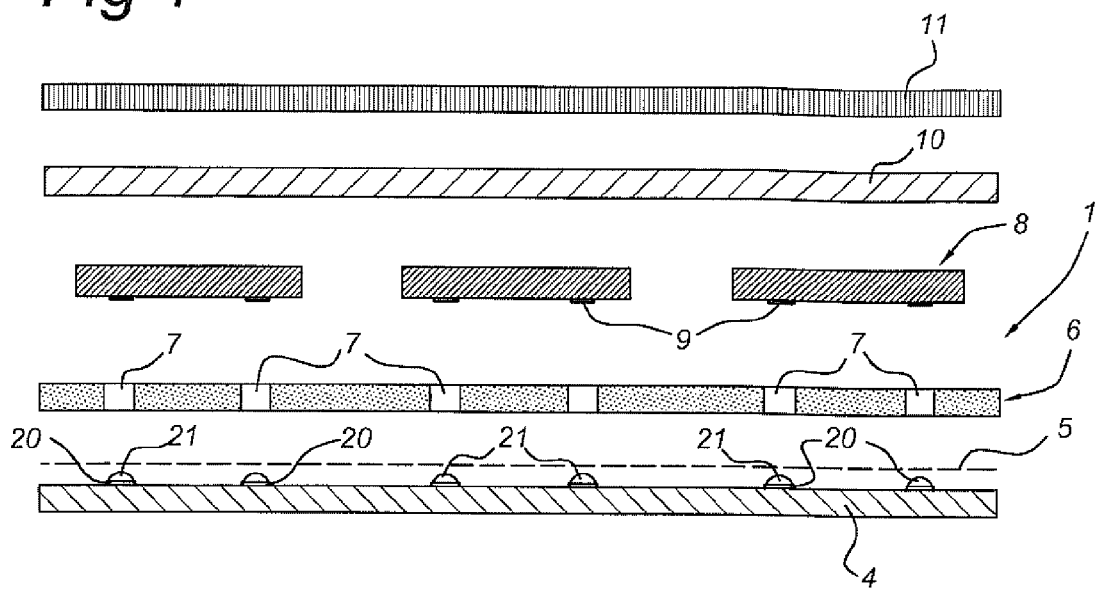
FIG. 1 shows an exploded side view of a stack for forming a solar panel.

As is illustrated in FIG. 1, a stack 1 for producing a solar panel comprises, from the bottom to the top, a film 4 which is arranged on the rear side and on which a pattern of electrically conductive wires 20 is provided. On the electrically conductive wires 20, spots or dots of adhesive 21 are applied. This is followed by an ethylene vinyl acetate layer 6 which is provided with holes 7. These holes 7 are arranged exactly over and around in each case a spot or dot of adhesive from electrically conductive bonding material 21. This electrically conductive bonding material 21 may, for example, be a silver contact adhesive or soldering paste.

Figure 2:
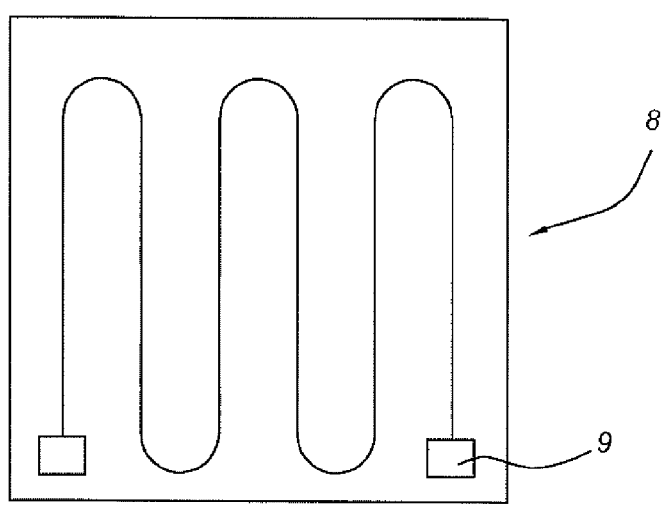
FIG. 2 shows a diagrammatic top view of a solar cell for this solar panel.

On top of the ethylene vinyl acetate layer 6, a series of solar cells 8 is arranged which, at the bottom, are provided with electric contacts 9 (see also FIG. 2), each of which is aligned with respect to a hole 7 in the layer 6. On top of the solar cells 8, a further ethylene vinyl acetate layer 10 is provided, while the top layer is formed by the glass plate 11.

With the installation from FIGS. 3 and 4 (which will be explained in more detail below), these different components are laid on top of one another, so that, contrary to what is shown in FIG. 1, there are no openings in between. In this state, the stack 1 is heated, so that the electrically conductive and heat-activatable adhesive 21 is activated. This results in bonding of the stack, while the electric contacts 9 come into electrically conductive contact with the electrically conductive wires 20 on the film 4. The stack is then introduced into an oven in order to cure the ethylene vinyl acetate layers 6, 10 and thus produce a finished solar panel 15. In a customary manner, this curing can be effected under excess pressure.

The installation for forming the stack 1 illustrated in FIGS. 3 and 4 comprises various stations in which different processes take place. These processes all take place on the so-called carriers 2. In station 12, each carrier 2 is provided with the rear film 4. Subsequently, in station 13, a series of dots of adhesive 21 is applied to the rear film 4, in particular to the electrically conductive wires 20. In station 14, the ethylene vinyl acetate layer 6 is then applied. The holes 7 thereof are aligned with respect to the dots of adhesive 21 on the electrically conductive wires 20.

In station 15, the solar cells 8 are provided in such a manner that the electric contacts 9 thereof are brought into contact with the dots of adhesive 21 on the electrically conductive wires via the holes 7 in the ethylene vinyl acetate layer 6.

Subsequently, a second ethylene vinyl acetate layer 10 is applied in station 16. This ethylene vinyl acetate layer is completely uninterrupted. In station 17, a glass plate 11 is provided. Subsequently, the stack which has been obtained in this way is heated to a moderate temperature in the auxiliary heating station 35, in such a manner that the different layers of the stack are fixed with respect to one another without the required ultimate bond being achieved. This fixing is advantageous in order to finally be able to turn over the carrier 2 with the entire stack 1 thereon in station 18. The stack can then be removed from the installation, in order to be taken to an oven for the purpose of heating to a higher temperature than in the auxiliary heating station 35 and for ultimate bonding of the different layers of the stack 1.

The carriers 2 are moved between the various stations in a manner which is known per se. Downstream of station 18, each carrier is moved to a lower level by means of the lift 5, and transferred to the return path denoted overall by reference numeral 19. This return path 19 takes the carriers 2 back to the lift 3 at the start of the installation, so that the carriers 2 are returned to a higher level which corresponds to that of said stations.

Figure 7:
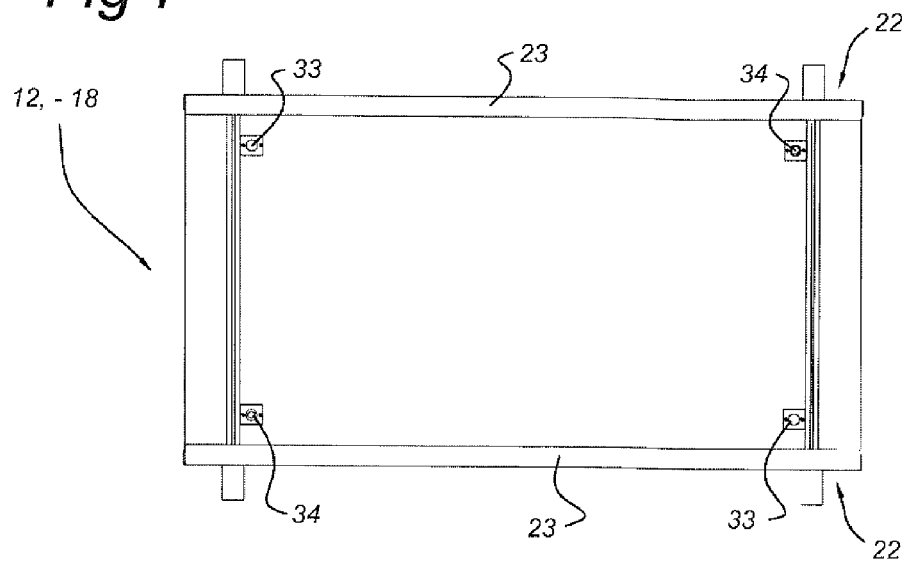
FIG. 7 shows a top view of the station without a carrier.
Figure 8:
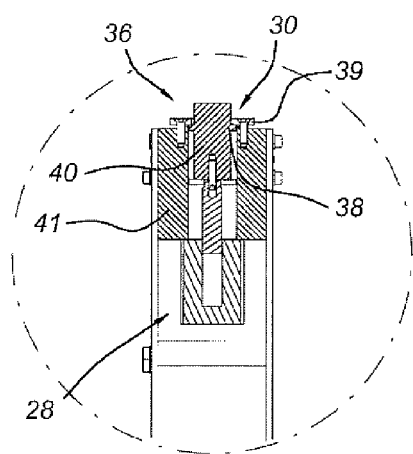
FIG. 8 shows detail VIII from FIG. 7.
Figure 9:
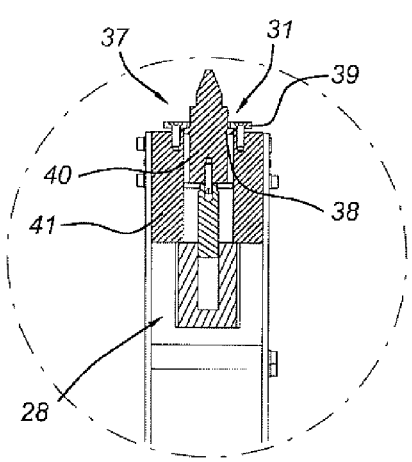
FIG. 9 shows detail IX from FIG. 7.

The views in FIGS. 5-7 show details of the stations 12-18. These stations have a frame 22 which comprises a top conveyor belt system 26 including two endless conveyor belts which extend next to one another and are deflected around the end rollers 24. Within this conveyor belt system, there are two positioning supports 30 with a flat upper supporting surface and two positioning supports with a tapering supporting surface 31. These positioning supports 30, 31 can be moved upwards and downwards, respectively, by means of the piston cylinder devices 28, 29, each of which is fitted to the frame 22, as is illustrated in FIGS. 8 and 9. In these figures, the positioning supports 30, 31 are shown in the upward position, which upward position is fixed by the stops 36, 37 which consist of a collar 38 on the plunger 40 of the supports 30, 31 and of a ring 39 on the cylinder 41.

On its bottom side, the carrier 2 has countersupports 33 and 34, respectively, provided with a receiving opening which is shaped in accordance with the associated positioning supports 30 and 31, respectively. As soon as the carrier has arrived above the frame, the positioning supports 30, 31 are moved upwards as a result of which the carrier is held securely as the positioning supports are inserted into the countersupports 33, 34. Attachment means 42 are provided on the frame 22 of the stations 12-18. By means of these attachment members, the frame 22 can in each case be suspended from the associated processing devices which comprise, for example, a robot arm, in order to carry out the abovementioned operations at the various stations. The position of the carrier on the supports 30, 31, 33, 34 with respect to these processing devices is then unambiguously determined, so that the operations in connection with the stacking of the various parts can be carried out accurately.

The carrier also has a bottom conveyor belt system 27 by means of which the carriers 2 can be returned from station 18 to station 12. The bottom conveyor belt systems 27 together form the return path 19. In this case, the lifts 3 and 5 move the carriers between the top and bottom conveyor belt system 26, 27. The carrier 2 furthermore has a vacuum system 32 for securely holding the stack composed of the various layers on the carrier.

Although the carrier and stations with the positioning supports and the countersupports are shown as being part of the installation for producing solar panels, these can also be used, in combination, for other purposes, aside from said installation.

In the abovementioned example, the thermoplastic layers 6, 10 consist of ethylene vinyl acetate. However, it is also possible to select other thermoplastic materials. The rear layer 4 is configured as a film. However, it is also possible to use a strong layer which can have a supporting function, such as a glass plate, instead of a film.

LIST OF REFERENCE NUMERALS

1. Stack
2. Carrier
3. Lift at start of installation
4. Rear film
5. Lift at end of installation
6. Perforated ethylene vinyl acetate layer
7. Hole
8. Solar cell
9. Electric contact of solar cell
10. Ethylene vinyl acetate layer
11. Glass plate
12. Station for applying rear film
13. Station for applying adhesive
14. Station for providing perforated ethylene vinyl acetate layer
15. Station for providing solar cells
16. Station for providing ethylene vinyl acetate layer
17. Station for providing glass plate
18. Station for turning over and removing the stack
19. Return path carriers
20. Electrically conductive wires
21. Dot of adhesive
22. Frame of station
23. Conveyor belt
24. Conveyor belt end roller
25. Conveyor belt intermediate roller
26. Top conveyor belt system
27. Bottom conveyor belt system
28. Piston/cylinder device
29. Piston/cylinder device with centring
30. Positioning support
31. Positioning support with centring
32. Vacuum means
33. Countersupport
34. Countersupport
35. Auxiliary heating station
36. Stop
37. Stop
38. Collar
39. Ring
40. Plunger
41. Cylinder

The invention claimed is:

1. A method for producing a solar panel containing a plurality of solar cells (8), comprising the following steps:
   providing a flat carrier (2), suitable for displacement between a series of treatment stations for carrying out the method and comprising a vacuum system for securely holding a layer or a stack of layers on the carrier,
   providing a rear layer (4) with electric conducting means (20) on the carrier (2),
   providing an electrically conductive bonding agent (21) on the electric conducting means (20),
   providing an electrically insulating thermoplastic insulation layer (6) on the rear layer (4), which insulation layer is provided with passages (7) to the electric conducting means (20),
   providing solar cells (8) on the insulation layer (6) in such a manner that the electric terminals (9) thereof come into contact electrically with the electrically conductive bonding agent (21) on the electric conducting means (20) via the passages (7),
   providing a light-transmitting thermoplastic layer (10) on the solar cells (8),
   providing a light-transmitting, rigid support layer (11) on the light-transmitting thermoplastic layer (10),
   supporting the stack (1) on the support layer (11) thereof, and
   removing the carrier (2),
   wherein the rear layer and any further layer provided thereon are securely held to one another and to the carrier by means of the vacuum system and are displaced between the series of treatment stations for carrying out the method.

2. A method according to claim 1, further comprising the following steps:
   at most partially melting the thermoplastic layers (6, 10) under the effect of heat before turning over the carrier (2),
   at most partially bonding or fixing the stack (1) by cooling down the thermoplastic layers (6, 10).

3. A method according to claim 2, further comprising the following steps:
   placing the stack (1) in an auxiliary heating station, in order to fix the stack,
   transferring the fixed stack (1), in a main heating station,
   heating the stack and subjecting it to excess pressure in the main heating station,
   cooling down the stack and releasing the excess pressure in order to form a solar panel.

4. A method according to claim 1, wherein the electrically conductive bonding agent (21) comprises a heat-activatable adhesive.

5. A method according to claim 1, further comprising the step of turning over the carrier (2) with the stack (1) comprising the rear layer, electrically insulating layer, solar cells, light-transmitting thermoplastic layer and support layer prior to supporting the stack on the support layer.

* * * * *